United States Patent
Kim et al.

(10) Patent No.: US 9,318,403 B2
(45) Date of Patent: Apr. 19, 2016

(54) INTEGRATED CIRCUIT PACKAGING SYSTEM WITH MAGNETIC FILM AND METHOD OF MANUFACTURE THEREOF

(75) Inventors: Sung Soo Kim, Seoul (KR); DongSik Kim, Kwangju-si (KR); ChoongHwan Kwon, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 335 days.

(21) Appl. No.: 13/211,303

(22) Filed: Aug. 16, 2011

(65) Prior Publication Data
US 2011/0298106 A1    Dec. 8, 2011

Related U.S. Application Data

(63) Continuation-in-part of application No. 11/768,041, filed on Jun. 25, 2007, now abandoned.

(51) Int. Cl.
| | |
|---|---|
| *H01L 21/56* | (2006.01) |
| *H01L 23/31* | (2006.01) |
| *H01L 23/552* | (2006.01) |
| *H01L 25/10* | (2006.01) |
| *H01L 25/00* | (2006.01) |

(Continued)

(52) U.S. Cl.
CPC ........ *H01L 23/3121* (2013.01); *H01L 23/3135* (2013.01); *H01L 23/552* (2013.01); *H01L 24/73* (2013.01); *H01L 25/03* (2013.01); *H01L 25/105* (2013.01); *H01L 25/50* (2013.01); H01L 24/13 (2013.01); H01L 24/29 (2013.01); H01L 24/45 (2013.01); H01L 24/48 (2013.01); H01L 24/49 (2013.01); H01L 25/0657 (2013.01); H01L 2224/16225 (2013.01); H01L 2224/16227 (2013.01); H01L 2224/32145 (2013.01); H01L 2224/32225 (2013.01); H01L 2224/45014 (2013.01); H01L 2224/48091 (2013.01); H01L 2224/48227 (2013.01); H01L 2224/49175 (2013.01); H01L 2224/731 (2013.01); H01L 2224/73204 (2013.01); H01L 2224/73253 (2013.01); H01L 2224/73265 (2013.01); H01L 2224/83102 (2013.01); H01L 2224/92125 (2013.01); H01L 2225/1023 (2013.01); H01L 2225/1041 (2013.01); H01L 2225/1058 (2013.01); H01L 2225/1088 (2013.01); H01L 2924/0103 (2013.01); H01L 2924/014 (2013.01); H01L 2924/01028 (2013.01); H01L 2924/01033 (2013.01); H01L 2924/01074 (2013.01); H01L 2924/01082 (2013.01); H01L 2924/12041 (2013.01); H01L 2924/14 (2013.01); H01L 2924/15311 (2013.01); H01L 2924/181 (2013.01); H01L 2924/1815 (2013.01);

(Continued)

(58) Field of Classification Search
CPC ... H01L 23/552; H01L 23/3121; H01L 25/50; H01L 21/56; H01L 21/563
USPC ............ 257/659–723, 777; 365/200; 438/108
See application file for complete search history.

(56) References Cited

U.S. PATENT DOCUMENTS

| | | |
|---|---|---|
| 4,661,837 A | 4/1987 | Sono |
| 4,953,002 A | 8/1990 | Nelson et al. |

(Continued)

*Primary Examiner* — Jerome Jackson, Jr.
*Assistant Examiner* — Fang-Xing Jiang
(74) *Attorney, Agent, or Firm* — Ishimaru & Associates LLP (57) ABSTRACT

An integrated circuit packaging system including: connecting a first integrated circuit device and a package substrate; attaching a support bump to the package substrate; providing a second integrated circuit device having an inner encapsulation; applying a magnetic film on the inner encapsulation of the second integrated circuit device; and mounting the second integrated circuit device over the first integrated circuit device with the magnetic film on the first integrated circuit device and the support bump.

19 Claims, 5 Drawing Sheets

(51) Int. Cl.
*H01L 25/03* (2006.01)
*H01L 23/00* (2006.01)
*H01L 25/065* (2006.01)

(52) U.S. Cl.
CPC .............. *H01L2924/19107* (2013.01); *H01L 2924/3011* (2013.01); *H01L 2924/3025* (2013.01); *H01L 2924/30107* (2013.01); *H01L 2924/3511* (2013.01)

(56) References Cited

U.S. PATENT DOCUMENTS

| | | | |
|---|---|---|---|
| 5,406,117 A | 4/1995 | Dlugokecki et al. | |
| 6,114,751 A | 9/2000 | Kumakura et al. | |
| 6,815,254 B2 * | 11/2004 | Mistry et al. | 438/108 |
| 6,906,416 B2 * | 6/2005 | Karnezos | 257/723 |
| 6,933,598 B2 | 8/2005 | Karnezos | |
| 7,078,243 B2 | 7/2006 | Spielberger et al. | |
| 2004/0061212 A1 * | 4/2004 | Karnezos | 257/686 |
| 2004/0100832 A1 * | 5/2004 | Nakajima | 365/200 |
| 2004/0113275 A1 * | 6/2004 | Karnezos | H01L 21/563 257/758 |
| 2004/0178499 A1 * | 9/2004 | Mistry | H01L 21/56 257/734 |
| 2004/0232536 A1 | 11/2004 | Fukuzumi | |
| 2005/0199992 A1 * | 9/2005 | Baek et al. | 257/686 |

* cited by examiner

INTEGRATED CIRCUIT PACKAGING SYSTEM WITH MAGNETIC FILM AND METHOD OF MANUFACTURE THEREOF

CROSS-REFERENCE TO RELATED APPLICATION(S)

This is a continuation-in-part of co-pending U.S. patent application Ser. No. 11/768,041 filed Jun. 25, 2007.

TECHNICAL FIELD

The present invention relates generally to an integrated circuit packaging system, and more particularly to an integrated circuit packaging system with multiple integrated circuits.

BACKGROUND ART

Integrated circuit packaging technology has seen an increase in the number of integrated circuits mounted on/over a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, computer servers, and storage servers, need more integrated circuits in the same or smaller "real estate".

Particularly acute, the needs for portable personal electronics, such as cell phones, digital cameras, music players, personal digital assistances, and location-based devices, have further driven the need for integrated circuit density. Modem portable electronic devices require a seamless integration of analog and digital subsystems. High-speed digital systems may switch at a high rate, such as more than one gigahertz. At such switching speeds, switching currents radiate energy (noise) that interferes with sensitive analog circuits or even other digital circuits. Interference usually takes the form of signal crosstalk.

Electromagnetic interference (EMI) is a generic term for unwanted interference energies either conducted as currents or radiated as electromagnetic fields. EMI can emanate from electronic devices in several ways. Generally, voltages and currents from integrated circuits create electric and magnetic fields that radiate from the integrated circuit device. EMI radiating from such integrated circuit devices will vary in field strength and impedance according to the shape and orientation of the conductors, the distance from the conductors to any shielding provided by circuit components or by coupling to circuit components.

As electronic devices and integrated circuits operate at higher and higher frequencies, EMI extends into the radio frequency spectrum and can cause significant interference with radio and television signals.

One typical scheme has been to provide a conductive enclosure to an electronic device so that EMI field lines will terminate on such enclosure. Unfortunately, conductive enclosures that contain the entire product or parts of the product can be very expensive. In addition, the need to increase integrated circuit density has led to the development of multi-chip packages in which more than one integrated circuit can be packaged.

The trend is to pack more integrated circuits and different types of integrated circuits into a single package, which requires EMI shielding within the package. Typically, metallic or conductive enclosures isolate the various integrated circuits from each other in a package. These solutions add manufacturing complexity, manufacturing cost, and hamper the size reduction of the multi-chip packages.

Further, as more integrated circuits and different types of integrated circuits are forming more complex multi-chip packages, it become increasingly important to test the integrated circuits prior to final assembly of the multi-chip packages. This ensures known good units (KGU) of the integrated circuits otherwise; the multi-chip package yield may be adversely impacted as well as increasing the cost of the multi-chip package.

Thus, a need still remains for an integrated circuit packaging system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

An integrated circuit packaging system including: connecting a first integrated circuit device and a package substrate; attaching a support bump to the package substrate; providing a second integrated circuit device having an inner encapsulation; applying a magnetic film on the inner encapsulation of the second integrated circuit device; and mounting the second integrated circuit device over the first integrated circuit device with the magnetic film on the first integrated circuit device and the support bump.

The present invention provides an integrated circuit packaging system, including: a package substrate; a first integrated circuit device connected to the package substrate; a support bump on the package substrate; a magnetic film on the first integrated circuit device and the support bump; and a second integrated circuit device having an inner encapsulation on the magnetic film and the support bump.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact between elements. The term "processing" as used herein includes deposition of material, patterning, exposure, development, etching, cleaning, molding, and/or removal of the material or as required in forming a described structure.

Figure 1:
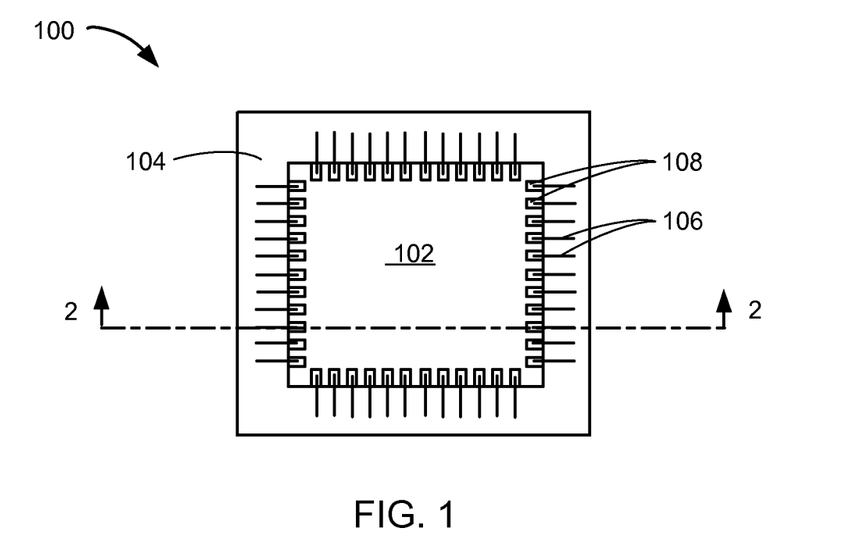
FIG. 1 is a plan view of an integrated circuit packaging system in a first embodiment of the present invention.

Referring now to FIG. 1, therein is shown a plan view of an integrated circuit packaging system 100 in a first embodiment of the present invention. The plan view depicts the integrated circuit packaging system 100 prior to package encapsulating process. The plan view depicts a carrier 102, such as a substrate, over a package substrate 104. Internal interconnects 106, such as bond wires or ribbon bond wires, connect pads 108, such as contact pads, of the carrier 102 and the package substrate 104.

Figure 2:
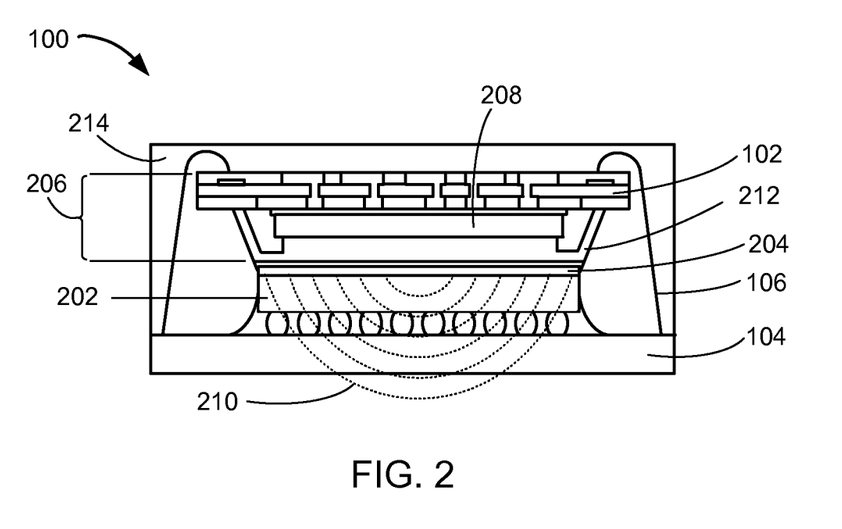
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a first integrated circuit device 202, such as a flip chip, mounted over the package substrate 104. A magnetic film 204 is over the first integrated circuit device 202. A second integrated circuit device 206, such as an integrated circuit package system, is over the magnetic film 204 and the first integrated circuit device 202.

The magnetic film 204 preferably functions as an electromagnetic interference (EMI) shield and a noise suppression structure between the first integrated circuit device 202 and the second integrated circuit device 206 without being tied to ground. The magnetic film 204 preferably includes a magnetic material, such as anti-noise components and wave absorbs. The magnetic film 204 includes noise deterrence properties with the use of the physical properties of magnetic or inductive materials. As a more specific example, the magnetic film 204 includes a polymer, such as epoxy or a phenol group polymer, and the magnetic material with anti-noise particles dispersed in the magnetic film 204. Examples of the anti-noise particles are nickel zinc ferrite or sendust with wave absorb. The materials of the magnetic film 204 preferably possess inductive properties for EMI suppression and resistive properties for EMI absorption providing an overall result of radiation attenuation. The magnetic film 204 may also preferably have adhesive materials for stacking the second integrated circuit device 206 over the first integrated circuit device 202.

For example, the first integrated circuit device 202 may provide radio frequency (RF) functions. The placement of the magnetic film 204 at appropriate positions, such as on the RF integrated circuit device, the stacked configuration in the integrated circuit packaging system 100 allows EMI shielding of the RF integrated circuit device, such as the first integrated circuit device 202, and avoid interference with an integrated circuit die 208 in the second integrated circuit device 206.

The magnetic film 204 may be applied as a small or large magnetic shield providing electromagnetic loss effects and magnetic shield effects without adversely affecting the far electrical field strength that determines transmission and reception performance of the RF integrated circuit device. Waves 210, such as magnetic flux loops, of concentric semi-ellipses illustrate the noise suppression effects in the integrated circuit packaging system 100. The waves 210 illustrate the effects of the magnetic film 204 absorbing the EMI energy from the first integrated circuit device 202 such that the waves 210 do not radiate to the second integrated circuit device 206 yet allowing the waves 210 to propagate from the first integrated circuit device 202 and the integrated circuit packaging system 100.

For illustrative purposes, the waves 210 depict the noise suppression by the magnetic film 204 from the first integrated circuit device 202 to the second integrated circuit device 206, although it is understood that the magnetic film 204 also suppresses noise from the second integrated circuit device 206 to the first integrated circuit device 202. Also for illustrative purposes, the magnetic film 204 is shown cover the horizontal surface of the first integrated circuit device 202, although it is understood that the magnetic film 204 may also cover the vertical surfaces of the first integrated circuit device 202.

For example, other integrated circuit devices (not shown) may be mounted on the package substrate 104 adjacent to the first integrated circuit device 202. The application of the magnetic film 204 over the vertical surfaces of the first integrated circuit device 202 also provides EMI shielding to the adjacent integrated circuit devices.

The second integrated circuit device 206 includes the carrier 102 and the integrated circuit die 208, wherein the integrated circuit die 208 is preferably mounted and connected to the carrier 102. An inner encapsulation 212, such as an epoxy molding compound, covers the integrated circuit die 208 below the carrier 102. The internal interconnects 106 connect the carrier 102 and the package substrate 104. A package encapsulation 214, such as an epoxy molding compound, covers the first integrated circuit device 202, the magnetic film 204, the second integrated circuit device 206, and the internal interconnects 106.

The first integrated circuit device 202 and the second integrated circuit device 206 may be tested without assembly of the integrated circuit packaging system 100. This ensures the first integrated circuit device 202 and the second integrated circuit device 206 assembled into the integrated circuit packaging system 100 are known good units (KGU) increasing manufacturing yield and lowering cost. For example, ensuring KGU eliminates the question if a failure in the integrated circuit packaging system 100 is caused by a fault regarding the magnetic film 204 or the second integrated circuit device 206 malfunctioning.

Figure 3:
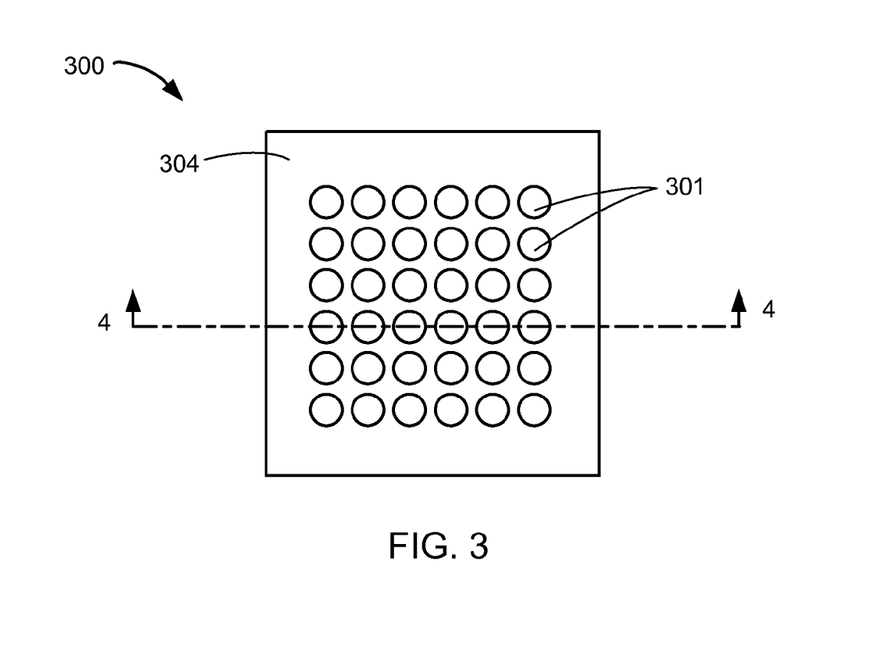
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The bottom view depicts external interconnects 301, such as solder balls, attached to a package substrate 304. For illustrative purposes, the external interconnects 301 are shown in an array configuration, although it is understood that the external interconnects 301 may be populated on the package substrate 304 in a different configuration, such as some locations may be depopulated. Also for illustrative purposes, the integrated circuit packaging system 300 is shown the package substrate 304 as a laminate type of carrier, although it is understood that the integrated circuit packaging system 300 may have other types of carrier for the package substrate 304, such as leads (not shown) formed from a lead frame (not shown).

Figure 4:
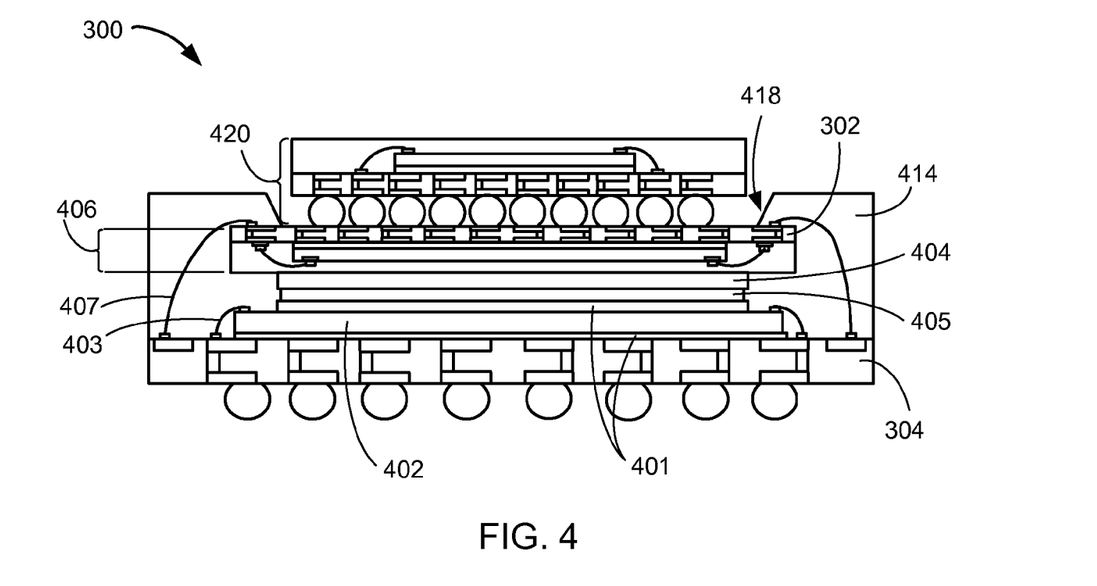
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. The cross-sectional view depicts a first integrated circuit device 402, such as an integrated circuit die, mounted over the package substrate 304 with an adhesive 401, such as die-attach adhesive. First internal interconnects 403, such as bond wires or ribbon bond wires, connect the first integrated circuit device 402 and the package substrate 304.

An intra-stack structure 405, such as an integrated circuit die or a spacer, preferably mounts over the first integrated circuit device 402 with the adhesive 401. A magnetic film 404 is over the intra-stack structure 405 and the first integrated circuit device 402. A second integrated circuit device 406, such as an integrated circuit package system, is over the magnetic film 404, the intra-stack structure 405, and the first integrated circuit device 402. Second internal interconnects 407, such as bond wires or ribbon bond wires, connect a carrier 302, such as a substrate, of the second integrated circuit device 406 and the package substrate 304.

A package encapsulation 414 covers the first integrated circuit device 402, the first internal interconnects 403, the intra-stack structure 405, the magnetic film 404, and the second internal interconnects 407. The package encapsulation 414 partially covers the second integrated circuit device 406 and includes a recess 418 exposing the carrier 302. A third integrated circuit device 420, such as an integrated circuit package system, mounts over the carrier 302 and in the recess 418. The integrated circuit packaging system 300 may also be referred to as an integrated circuit package-on-package system.

The magnetic film 404 preferably includes the materials and properties of the magnetic film 204 of FIG. 2 as well as provide similar functions. For example, the magnetic film 404 preferably functions as an electromagnetic interference (EMI) shield and a noise suppression structure isolating the first integrated circuit device 402 from the second integrated circuit device 406 and the third integrated circuit device 420.

Another example, if the intra-stack structure 405 is an active integrated circuit device, the magnetic film 404 preferably functions as an electromagnetic interference (EMI) shield and a noise suppression structure isolating the intra-stack structure 405 from the second integrated circuit device 406 and the third integrated circuit device 420.

For illustrative purposes, the magnetic film 404 is shown cover the horizontal surface of the intra-stack structure 405, although it is understood that the magnetic film 404 may also cover the vertical surfaces of the intra-stack structure 405. Also for illustrative purposes, the magnetic film 404 is shown over the intra-stack structure 405, although it is understood that the magnetic film 404 may also cover the first integrated circuit device 402. Further for illustrative purposes, the integrated circuit packaging system 300 is shown with one application of the magnetic film 404, although it is understood that the magnetic film 404 may be applied at any number of location in the stack within the integrated circuit packaging system 300.

Figure 5:
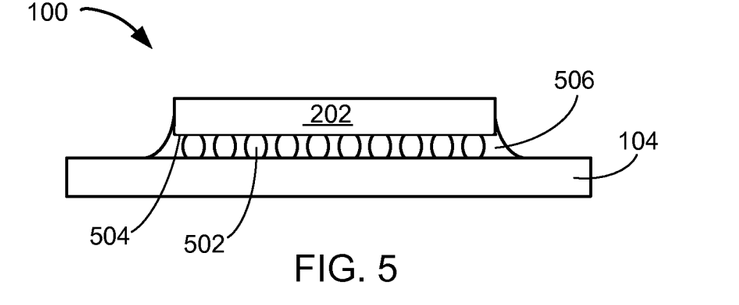
FIG. 5 is a cross-sectional view of the integrated circuit packaging system of FIG. 2 in a mounting phase of the first integrated circuit device.

Referring now to FIG. 5, therein is shown a cross-sectional view of the integrated circuit packaging system 100 of FIG. 2 in a mounting phase of the first integrated circuit device 202. The cross-sectional view depicts the first integrated circuit device 202 includes device interconnects 502, such as solder bumps, on an active side 504 of the first integrated circuit device 202. The first integrated circuit device 202 preferably mounts on the package substrate 104 with the device interconnects 502 attached to the package substrate 104. A filler 506, such as an epoxy molding compound, is preferably under the first integrated circuit device 202 and surrounds the device interconnects 502.

Figure 6:
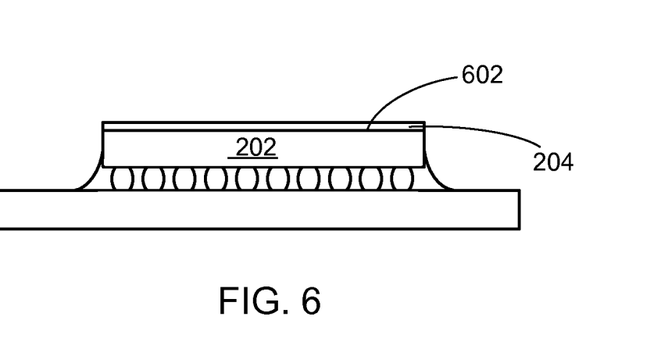
FIG. 6 is the structure of FIG. 5 in an attaching phase of the magnetic film.

Referring now to FIG. 6, therein is shown the structure of FIG. 5 in an attaching phase of the magnetic film 204. The magnetic film 204 is applied over a passive side 602 of the first integrated circuit device 202. The magnetic film 204 may be formed to a number of configurations as needed through patterning steps or multiple application steps.

Figure 7:
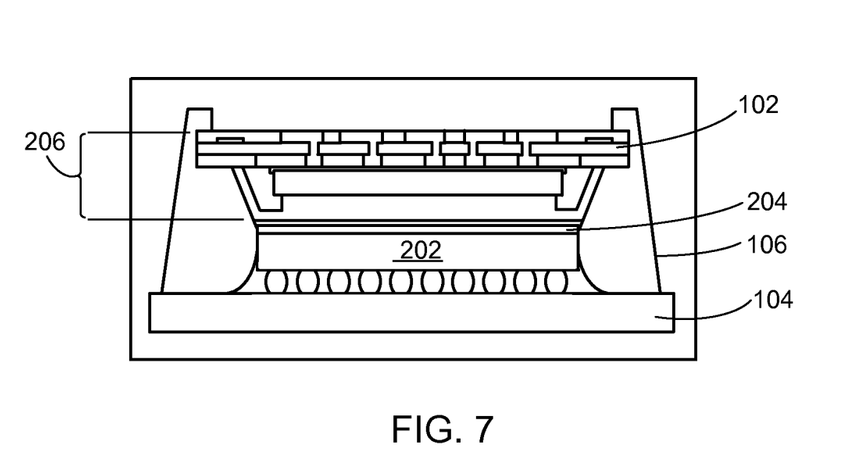
FIG. 7 is the structure of FIG. 6 in a connecting phase of the internal interconnects.

Referring now to FIG. 7, therein is shown the structure of FIG. 6 in a connecting phase of the internal interconnects 106. The second integrated circuit device 206 is preferably stacked over the first integrated circuit device 202 with the magnetic film 204 between the first integrated circuit device 202 and the second integrated circuit device 206. The internal interconnects 106 connect the carrier 102 of the second integrated circuit device 206 and the package substrate 104.

Figure 8:
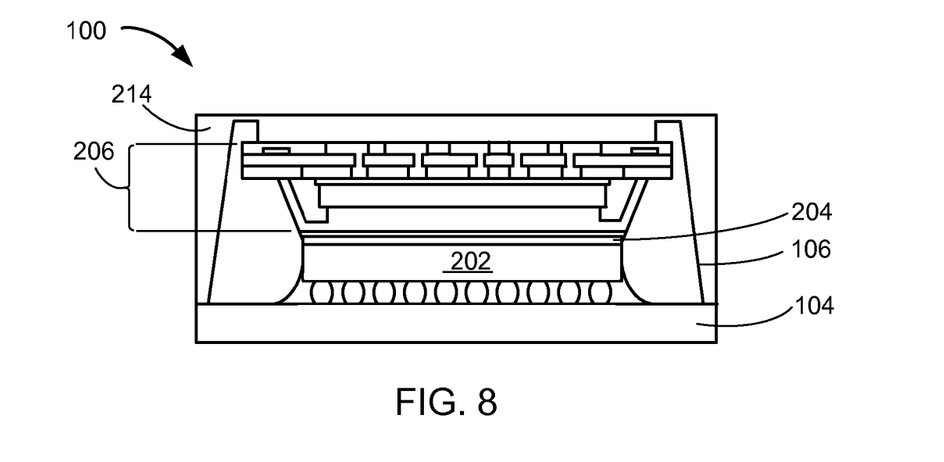
FIG. 8 is the structure of FIG. 7 in a forming phase of the integrated circuit packaging system.

Referring now to FIG. 8, therein is shown the structure of FIG. 7 in a forming phase of the integrated circuit packaging system 100. The structure of FIG. 7 undergoes an encapsulating step for forming the package encapsulation 214 over the first integrated circuit device 202, the magnetic film 204, the second integrated circuit device 206, the internal interconnects 106, and the package substrate 104. The encapsulated structure of FIG. 7 may also undergo singulation forming the integrated circuit packaging system 100.

Figure 9:
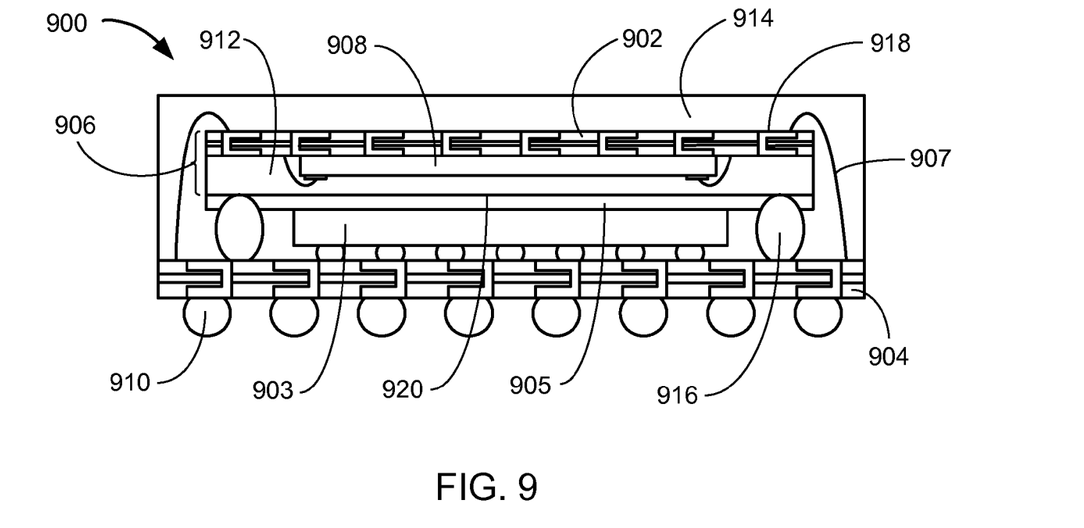
FIG. 9 is a cross-sectional view of an integrated circuit packaging system exemplified by the plan view along line 2-2 of FIG. 1 in a third embodiment of the present invention.

Referring now to FIG. 9, therein is shown a cross-sectional view of an integrated circuit packaging system 900 exemplified by the plan view along line 2-2 of FIG. 1 in a third embodiment of the present invention. The integrated circuit packaging system 900 is shown having a first integrated circuit device 903, such as a flip chip, mounted over a package substrate 904 on which an external interconnect 910 is attached. A magnetic film 905 is on a second integrated circuit device 906. A support bump 916 can support the edges of the second integrated circuit device 906. The second integrated circuit device 906, such as an integrated circuit package, can have a bond pad 918 and can have a non-active surface 920 completely covered by the magnetic film 905. The second integrated circuit device 906 can be larger in size than the first integrated circuit device 903.

The magnetic film is defined as a material having a high magnetic permeability. The magnetic film 905 can function as an electromagnetic interference (EMI) shield and a noise suppression structure. The magnetic film 905 can be on and between the first integrated circuit device 903 and the second integrated circuit device 906. The magnetic film can be tied to ground with the support bump 916. For example, the magnetic film 905 can include a magnetic material, such as anti-noise components and wave absorbs. The magnetic film 905 can include noise deterrence properties with the use of the physical properties of magnetic or inductive materials. As a more specific example, the magnetic film 905 can include a polymer, such as epoxy or a phenol group polymer, and the magnetic material with anti-noise particles dispersed in the magnetic film 905. Examples of the anti-noise particles are nickel zinc ferrite or sendust with wave absorb.

The materials of the magnetic film 905 preferably possess inductive properties for EMI suppression and resistive properties for EMI absorption providing an overall result of radiation attenuation. The magnetic film 905 may also preferably have adhesive materials for stacking the second integrated circuit device 906 over the first integrated circuit device 903. The magnetic film 905 can shield a range of frequencies. For example, the magnetic film 905 can shield effectively from 100 MHz to 10 GHz, though it is understood that other ranges are also possible. The magnetic film 905 can also have a high relative permeability. The magnetic film 905 can be a good thermal conductor with a thermal conductivity similar to thermal grease or thermal epoxy such as 1.4 W/mK, for example.

For example, the first integrated circuit device 903 may provide radio frequency (RF) functions. The placement of the magnetic film 905 at appropriate positions, such as on the RF integrated circuit device, the stacked configuration in the integrated circuit packaging system 900 allows EMI shielding of the RF integrated circuit device, such as the first integrated circuit device 903, and avoid interference with an integrated circuit die 908 in the second integrated circuit device 906. The magnetic film 905 may be applied as a small or large magnetic shield providing electromagnetic loss effects and magnetic shield effects without adversely affecting the far electrical field strength that determines transmission and reception performance of the RF integrated circuit device. The magnetic film 905 can absorb EMI energy from the first integrated circuit device 903 such that signals can radiate from the first integrated circuit device 903 without interfering with the operation of the second integrated circuit device 906.

The support bump 916 is defined as a conductive structure that can provide a path to ground while also providing physical support to components above the support bump 916. The support bump 916 can take many forms. For example, the support bump 916 can be a solder ball, a conductive column, a pillar, or metal bump. The support bump 916 can be positioned under the center of a bond pad 918 on the second integrated circuit device 906. The support bump 916 can penetrate the magnetic film 905 and can contact the second integrated circuit device 906. The support bump 916 can function to ground the magnetic film 905. The support bump 916 can be on the package substrate 904 and can connect to ground through the package substrate 904.

It has been discovered that the support bump 916 positioned directly under the bond pad 918 can provide mechanical support for the second integrated circuit device 906 preventing warpage and leading to increased reliability even after the stress of wire bonding. For example, because the second integrated circuit device 906 is larger than and overhangs the first integrated circuit device 903, a wire bonding process can place stress on the edge of the second integrated circuit device 906, which can be alleviated by the support bump 916 positioned under the bond pad 918 and in contact with the second integrated circuit device 906. Also for example, the support bump 916 positioned under the bond pad 918 near the edge of the second integrated circuit device 906 can support the second integrated circuit device 906 and prevent damage to the edges of the first integrated circuit device 903 due to pressure from the second integrated circuit device 906 during wire-bonding.

The second integrated circuit device 906 includes a carrier 902 and the integrated circuit die 908. The integrated circuit die 908 is preferably mounted and connected to the carrier 902. An inner encapsulation 912, such as an epoxy molding compound, covers the integrated circuit die 908 below the carrier 902. The second integrated circuit device 906 can have the non-active surface 920 opposite the carrier 902. The non-active surface 920 can be a planar surface of the inner encapsulation 912 opposite the carrier 902. The bond pad 918 can be located on the carrier 902 and can be a site for wire bonding on the second integrated circuit device 906. For example, the bond pad 918 can be located at the edge of the second integrated circuit device 906.

Internal interconnects 907, such as bond wires or ribbon bond wires, can connect the carrier 902 and the package substrate 904. The internal interconnects 907 can connect the bond pad 918 and the package substrate 904. A package encapsulation 914 covers the first integrated circuit device 903, the magnetic film 905, the second integrated circuit device 906, and the internal interconnects 907. The encapsulation 914 is defined as a molding compound. For example, the encapsulation 914 can be a film assisted molding, epoxy molding, or other protective molding, and can protect sensitive components from moisture, dust and other contamination. The sides of the package encapsulation 914 can be planar and can also be coplanar with the sides of the package substrate 904. The top of the package encapsulation 914 can be a planar surface that forms a right angle with the sides of the package encapsulation 914.

The integrated circuit packaging system 900 can be manufactured in a number of ways. For example, the second integrated circuit device 906 can be manufactured in a large sheet containing multiple instances of the second integrated circuit device 906, with the integrated circuit die 908 mounted on the carrier 902. The integrated circuit die 908 and the carrier 902 can be covered by the inner encapsulation 912. The magnetic film 905 can be applied on the inner encapsulation 912. The instances of the second integrated circuit device 906 can be singulated creating a planar side of the second integrated circuit device 906. The singulation process can leave the non-horizontal sides of the magnetic film 905, the inner encapsulation 912, and the carrier 902 all parallel with each other.

Also for example, the first integrated circuit device 903 can be mounted on the package substrate 904. The support bump 916 can be attached to the package substrate 904 adjacent to the first integrated circuit device 903. The height of the support bump 916 can be slightly higher than the height of the first integrated circuit device 903. The second integrated circuit device 906 with the magnetic film 905 can be mounted on the support bump 916 and the first integrated circuit device 903.

The second integrated circuit device 906, which is larger than the first integrated circuit device 903, can be mounted such that the magnetic film 905 contacts the first integrated circuit device 903 and the support bump 916 penetrates the magnetic film 905 and contacts the inner encapsulation 912 of the second integrated circuit device 906. The magnetic film 905 extends beyond the surface of the first integrated circuit device 903 and includes a bottom surface of the magnetic film 905 between the first integrated circuit device 903 and the support bump 916. The bottom surface of the magnetic film 905 is spaced away from the package substrate 904. The internal interconnects 907 can be attached to connect the bond pad 918 on the carrier 902 of the second integrated circuit device 906 to the package substrate 904. The package encapsulation 914 can then be molded on the first integrated circuit device 903, the second integrated circuit device 906, the support bump 916, the internal interconnect 907, the magnetic film 905, and the package substrate 904. The package encapsulation 914 can fill the space between the bottom surface of the magnetic film 905 and the package substrate 904.

The first integrated circuit device 903 and the second integrated circuit device 906 may be tested without assembly of the integrated circuit packaging system 900. This ensures the first integrated circuit device 903 and the second integrated circuit device 906 assembled into the integrated circuit packaging system 900 are known good units (KGU) increasing manufacturing yield and lowering cost. For example, ensuring KGU eliminates the question if a failure in the integrated circuit packaging system 900 is caused by a fault regarding the magnetic film 905 or the second integrated circuit device 906 malfunctioning.

Figure 10:
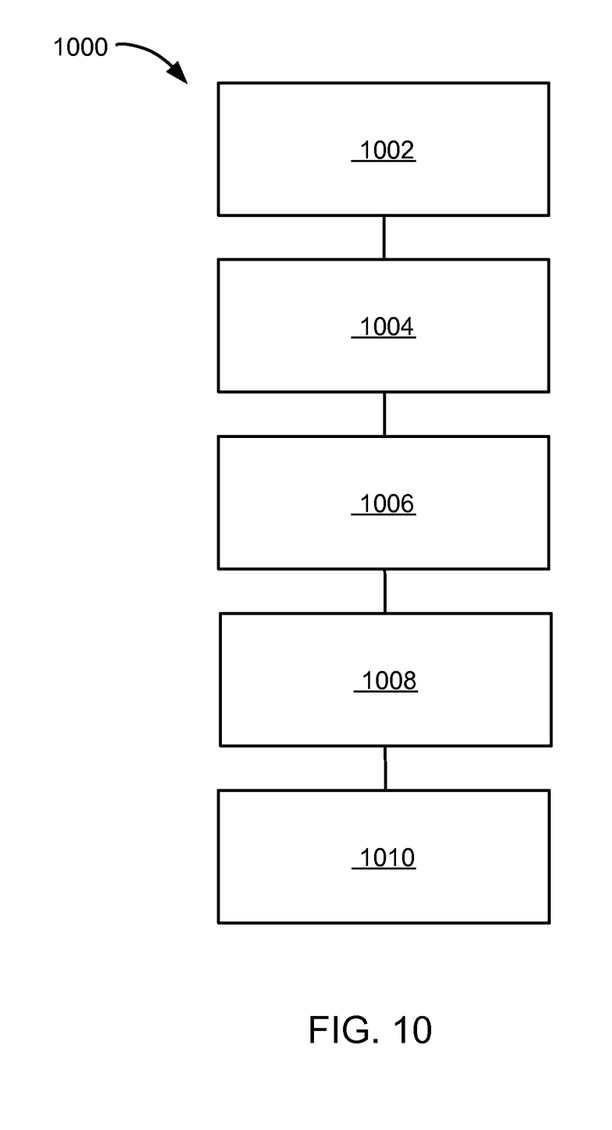
FIG. 10 is a flow chart of a method of manufacture of the integrated circuit packaging system in a further embodiment of the present invention.

Referring now to FIG. 10, therein is shown a flow chart of a method 1000 of manufacture of the integrated circuit packaging system 900 in a further embodiment of the present invention. The method 1000 includes connecting a first integrated circuit device and a package substrate in a block 1002; attaching a support bump to the package substrate in a block 1004; providing a second integrated circuit device having an inner encapsulation in a block 1006; applying a magnetic film on the inner encapsulation of the second integrated circuit device in a block 1008; and mounting the second integrated circuit device over the first integrated circuit device with the magnetic film on the first integrated circuit device and the support bump in a block 1010.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   connecting a first integrated circuit device and a package substrate;
   attaching a support bump to the package substrate;
   providing a second integrated circuit device, larger than the first integrated circuit device, having an inner encapsulation;
   applying a magnetic film on the inner encapsulation of the second integrated circuit device; and
   mounting the second integrated circuit device over the first integrated circuit device with the magnetic film on the first integrated circuit device and the support bump, a bottom surface of the magnetic film spaced away from the package substrate, the support bump penetrating the magnetic film to contact the inner encapsulation of the second integrated circuit device.

2. The method as claimed in claim 1 further comprising forming a package encapsulation on the first integrated circuit device, the magnetic film, and the second integrated circuit device.

3. The method as claimed in claim 1 wherein mounting the second integrated circuit device includes providing an integrated circuit die in the inner encapsulation.

4. The method as claimed in claim 1 wherein applying the magnetic film on the second integrated circuit device includes fully covering a non-active surface of the second integrated circuit device with the magnetic film.

5. The method as claimed in claim 1 wherein mounting the second integrated circuit device includes electrically connecting the second integrated circuit device with the package substrate.

6. A method of manufacture of an integrated circuit packaging system comprising:
   connecting a first integrated circuit device having radio frequency circuitry therein and a package substrate;
   attaching a support bump to the package substrate;
   providing a second integrated circuit device, larger than the first integrated circuit device, includes:
      providing an integrated circuit die connected to a carrier, and encapsulating with an inner encapsulation the integrated circuit die;
   applying a magnetic film on the inner encapsulation of the second integrated circuit device;
   mounting the second integrated circuit device over the first integrated circuit device with the magnetic film on the first integrated circuit device and the support bump, a bottom surface of the magnetic film spaced away from the package substrate, the support bump penetrating the magnetic film to contact the inner encapsulation of the second integrated circuit device; and
   forming a package encapsulation on the first integrated circuit device, the magnetic film, and the second integrated circuit device including forming the package encapsulation to fill a space between the bottom surface of the magnetic film and the package substrate.

7. The method as claimed in claim 6 wherein applying the magnetic film includes applying materials comprised of a magnetic particle and a polymer having inductive and resistive properties.

8. The method as claimed in claim 6 wherein applying the magnetic film includes applying an adhesive.

9. The method as claimed in claim 6 further comprising electrically connecting the support bump to ground.

10. The method as claimed in claim 6 wherein connecting the first integrated circuit device includes connecting a flip chip.

11. An integrated circuit packaging system comprising:
a package substrate;
a first integrated circuit device connected to the package substrate;
a support bump on the package substrate;
a magnetic film on the first integrated circuit device and the support bump, a bottom surface of the magnetic film spaced away from the package substrate;
a second integrated circuit device, larger than the first integrated circuit device, having an inner encapsulation on the magnetic film and the support bump penetrating the magnetic film to contact the inner encapsulation of the second integrated circuit device; and
a package encapsulation on the support bump, the first integrated circuit device, the magnetic film, and the second integrated circuit device including the package encapsulation filling a space between the bottom surface of the magnetic film and the package substrate.

12. The system as claimed in claim 11 wherein the second integrated circuit device includes an integrated circuit die in the inner encapsulation.

13. The system as claimed in claim 11 wherein the magnetic film fully covers a non-active surface of the second integrated circuit device.

14. The system as claimed in claim 11 wherein the second integrated circuit device is electrically connected with the package substrate.

15. The system as claimed in claim 11 wherein:
the first integrated circuit device includes radio frequency circuitry;
the magnetic film fully covers a non-active surface of the second integrated circuit device; and
the second integrated circuit device includes an integrated circuit die connected to a carrier.

16. The system as claimed in claim 15 wherein the magnetic film is comprised of a magnetic particle and a polymer having inductive and resistive properties.

17. The system as claimed in claim 15 wherein the magnetic film is an adhesive.

18. The system as claimed in claim 15 further comprising the support bump electrically connected to ground.

19. The system as claimed in claim 15 wherein the first integrated circuit device is a flip chip.

* * * * *